(12) United States Patent
Yoneyama

(10) Patent No.: US 10,321,582 B2
(45) Date of Patent: Jun. 11, 2019

(54) METHOD OF MANUFACTURING WIRING BOARD AND WIRING BOARD

(71) Applicant: OLYMPUS CORPORATION, Tokyo (JP)

(72) Inventor: Jumpei Yoneyama, Nagano (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/652,337

(22) Filed: Jul. 18, 2017

(65) Prior Publication Data

US 2017/0318684 A1    Nov. 2, 2017

Related U.S. Application Data

(63) Continuation of application No. PCT/JP2015/051883, filed on Jan. 23, 2015.

(51) Int. Cl.
*H05K 3/46* (2006.01)
*H05K 3/40* (2006.01)
*H05K 1/11* (2006.01)
*H05K 3/34* (2006.01)
*H05K 3/36* (2006.01)

(52) U.S. Cl.
CPC ............ *H05K 3/4682* (2013.01); *H05K 1/11* (2013.01); *H05K 3/3405* (2013.01); *H05K 3/368* (2013.01); *H05K 3/40* (2013.01); *H05K 3/4092* (2013.01); *H05K 3/4644* (2013.01); *H05K 2201/0367* (2013.01); *H05K 2201/09827* (2013.01); *H05K 2201/1075* (2013.01); *H05K 2201/10787* (2013.01); *H05K 2201/10803* (2013.01); *H05K 2201/10931* (2013.01)

(58) Field of Classification Search
CPC .......... H01R 9/091; H05K 1/117; H05K 3/46; H05K 3/4602; H05K 3/4611
See application file for complete search history.

(56) References Cited

U.S. PATENT DOCUMENTS 5,541,449 A * 7/1996 Crane, Jr. ............... H01L 24/73
257/692
2012/0111608 A1   5/2012 Kamei et al.

FOREIGN PATENT DOCUMENTS

| JP | H07-014886 A | 1/1995 |
| JP | 2002-184546 A | 6/2002 |
| JP | 2006-078404 A | 3/2006 |
| JP | 2008-235656 A | 10/2008 |

(Continued)

OTHER PUBLICATIONS

International Search Report dated Apr. 7, 2015 issued in PCT/JP2015/051883.

*Primary Examiner* — Jeremy C Norris
(74) *Attorney, Agent, or Firm* — Scully, Scott, Murphy & Presser, P.C.

(57) ABSTRACT

A method of manufacturing a wiring board includes a stacking process in which N (N is an integer equal to or greater than 2) wiring layers, end portions of which include linear conductor patterns, are stacked, with the end portions superimposed, via substrates (insulating layers) provided among the wiring layers and a laminated plate is manufactured and a removing process in which the insulating layers around the end portions of the conductor patterns of the laminated plate are removed to machine the end portions into N flying leads projecting from an end face.

11 Claims, 15 Drawing Sheets

(56) References Cited

FOREIGN PATENT DOCUMENTS

| | | |
|---|---|---|
| JP | 2008-235791 A | 10/2008 |
| JP | 2011-129604 A | 6/2011 |
| JP | 2012-099762 A | 5/2012 |
| WO | WO 2015/125777 A1 | 8/2015 |

\* cited by examiner

METHOD OF MANUFACTURING WIRING BOARD AND WIRING BOARD

CROSS REFERENCE TO RELATED APPLICATION

This application is a continuation application of PCT/JP2015/051883 filed on Jan. 23, 2015, the entire contents of which are incorporated herein by this reference.

BACKGROUND OF THE INVENTION

1. Field of the Invention

The present invention relates to a method of manufacturing a wiring board, from an end face of which flying leads project, and the wiring board.

2. Description of the Related Art

A semiconductor apparatus in which flying leads projecting from an end face of a wiring board are bonded to bonding electrodes disposed in a row in a semiconductor chip is widely used. In a micro semiconductor chip, a plurality of bonding electrodes are disposed in a row at a narrow pitch.

When flying leads are arrayed at a narrow pitch according to the array pitch of the bonding electrodes, it is likely that the flying leads are short-circuited. In a wiring board on which conductor wires are manufactured by etching of copper foil or the like, to reduce a pitch, an etching technique for forming gaps with extremely high accuracy and a high aspect ratio is necessary. That is, manufacturing of a wiring board including narrow-pitch flying leads is not easy.

Japanese Patent Application Laid-Open Publication No. 2008-235791 discloses a semiconductor apparatus in which portions triangular in a sectional shape and portions square in a sectional shape are manufactured in conductor wires of a wiring board and the portions triangular in the sectional shape of the conductor wires are machined into flying leads and bonded to bonding electrodes of a semiconductor chip.

SUMMARY OF THE INVENTION

A method of manufacturing a wiring board of an embodiment of the present invention includes: a stacking process in which N (N is an integer equal to or greater than 2) wiring layers, end portions of which include linear conductor patterns, are stacked, with the end portions superimposed, via insulating layers provided among the wiring layers and a laminated plate is manufactured; and a removing process in which the insulating layers around the end portions of the conductor patterns of the laminated plate are removed to machine the end portions into N flying leads projecting from an end face.

Further, a wiring board of another embodiment is manufactured by a manufacturing method including: a stacking process in which N (N is an integer equal to or greater than 2) wiring layers, end portions of which include linear conductor patterns, are stacked, with the end portions superimposed, via insulating layers provided among the wiring layers and a laminated plate is manufactured; and a removing process in which the insulating layers around the end portions of the conductor patterns of the laminated plate are removed to machine the end portions into N flying leads projecting from an end face.

According to the present invention, it is possible to provide a method of easily manufacturing a wiring board including narrow-pitch flying leads and the wiring board manufactured by the manufacturing method.

DETAILED DESCRIPTION OF THE PREFERRED EMBODIMENTS

<First Embodiment>

Figure 1:
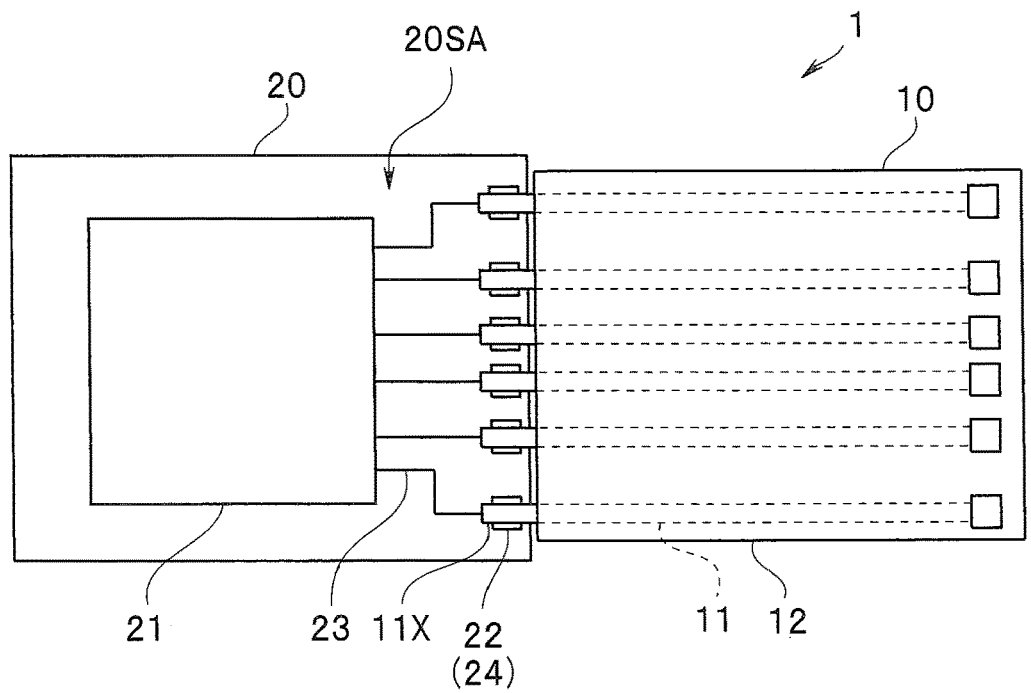
FIG. 1 is a top view of a semiconductor apparatus including a wiring board of a first embodiment.
Figure 2:
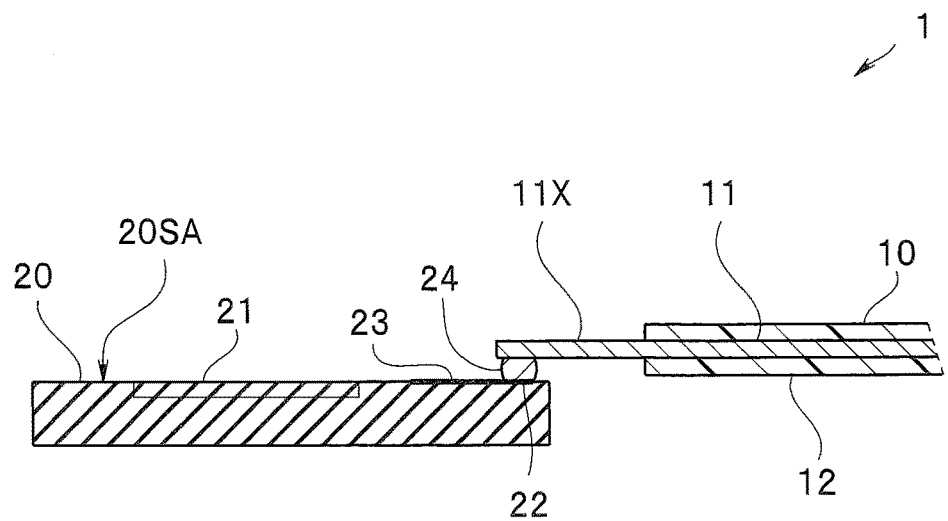
FIG. 2 is a sectional view taken along line II-II in FIG. 1 of the semiconductor apparatus including the wiring board of the first embodiment.

As shown in FIG. 1 and FIG. 2, a wiring board 10 manufactured by a manufacturing method of the present embodiment includes a semiconductor apparatus 1 together with a semiconductor chip 20.

It should be noted that both of the drawings are schematic examples and relations among thicknesses, widths, and depths of respective portions, ratios of the thicknesses, the number of stacked layers, the number of flying leads, and the like are different from real ones. Portions, relations and ratios of dimensions of which are different from one another, are sometimes included among the drawings. There are some components, illustration and explanation of which are omitted.

A semiconductor circuit 21 is formed on a principal plane 20SA of the substantially rectangular parallelepiped semiconductor chip 20 made of a semiconductor such as silicon. A plurality of bonding electrodes 22 connected to the semiconductor circuit 21 by wires 23 are disposed in a row along an end side of the principal plane 20SA. For example, when the semiconductor circuit 21 is a light receiving section such as a CMOS image sensor, the semiconductor chip 20 is an image pickup device and the semiconductor apparatus 1 is an image pickup apparatus.

Bumps 24 made of metal having a convex shape are disposed in the bonding electrodes 22. Height and a diameter of the bumps 24 are, for example, 40 µm or more and 100 µm or less in order to guarantee satisfactory bonding strength. The bumps 24 are gold bumps disposed by a stud bump method in the flat bonding electrodes 22. A bump forming method may be a plating method or the like. A bump material may be solder or the like.

The wiring board 10 is a connection structure disposed between the semiconductor chip 20 and a not-shown external cable or the like. In the wiring board 10, portions projecting from an end face of a substrate 12 of end portions of four metal lead wires 11 embedded in the substrate 12 made of an insulator are formed as flying leads 11X1 to 11X4. Note that, in the following explanation, numbers at ends of reference signs respectively indicating a plurality of components having the same functions are not shown. For example, each of the flying leads 11X1 to 11X4 is referred to as flying lead 11X.

The flying lead 11X is sometimes called inner lead in a wiring board of a lead frame structure. For example, thickness and width of the flying lead 11X are 1 µm or more and 50 µm or less and length of the flying lead 11X is 20 µm or more and 500 µm or less.

As explained below, in the wiring board 10, an end portion of the metal lead wire 11 is machined into the flying lead 11X by removing an insulator at an end portion of a laminated plate including the metal lead wire 11 embedded in the substrate 12 entirely made of the insulator. That is, the metal lead wire 11 and the flying lead 11X covered with the substrate 12 are an integral object without a boundary made of the same material.

As explained below, the substrate 12 is configured from a plurality of insulating layers 12L stacked in a direction in which a plurality of flying leads 11X are disposed in a row (a Z direction).

Figure 3:
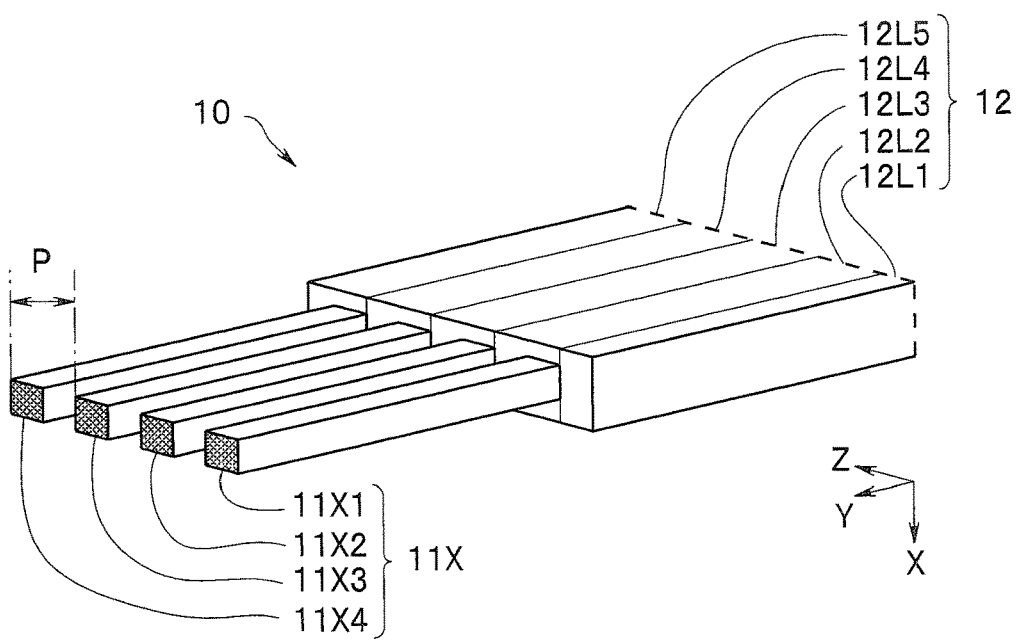
FIG. 3 is a perspective view of the wiring board of the first embodiment.

Note that, in FIG. 1, the wiring board 10 including six flying leads 11X is illustrated. However, the wiring board 10 only has to include N (N is an integer equal to or greater than 2) flying leads 11X. For example, in FIG. 3 and the like, the wiring board 10 includes four flying leads 11X1 to 11X4.

For example, the semiconductor chip 20 is ultra-small with the principal plane 20SA of 0.1 mm×0.1 mm or more and 5.0 mm×5.0 mm or less and thickness of 10 µm or more and 300 µm or less. Therefore, a disposition pitch P of the plurality of bonding electrodes 22 is extremely narrow at, for example 100 µm or less. A lower limit of the disposition pitch P is, for example, 10 µm because of a technical limit. Note that the disposition pitch P of the flying leads 11X of the wiring board 10 corresponds to the disposition pitch P of the bonding electrodes 22.

The wiring board 10 includes the narrow-pitch flying leads 11X. However, as explained below, since the wiring board 10 is manufactured by a characteristic manufacturing method, short-circuit among the flying leads 11X adjacent to one another does not occur.

<Method of Manufacturing a Wiring Board>

Figure 4:
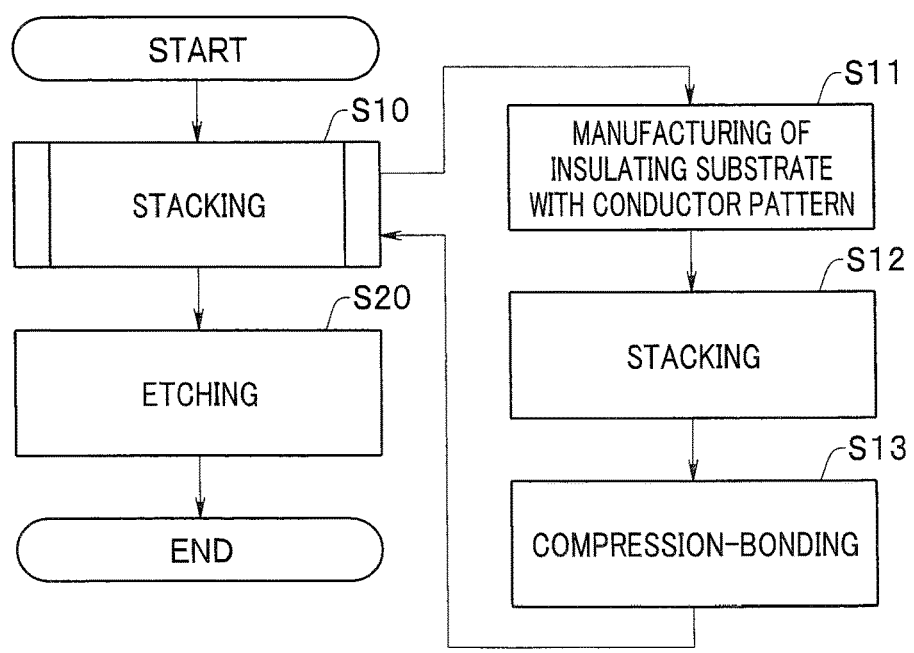
FIG. 4 is a flowchart for explaining the method of manufacturing the wiring board of the first embodiment.

A method of manufacturing a wiring board of the embodiment is explained according to a flowchart shown in FIG. 4.

<Step S10> Stacking Process

A stacking process (S10) for the wiring board 10 is a sub-routine including step S11 (a manufacturing process for an insulating substrate with a conductor pattern attached), step S12 (a stacking process), and step S13 (a compression-bonding process).

<Manufacturing Process for an Insulating Substrate with a Conductor Pattern Attached: S11>

Figure 5A:
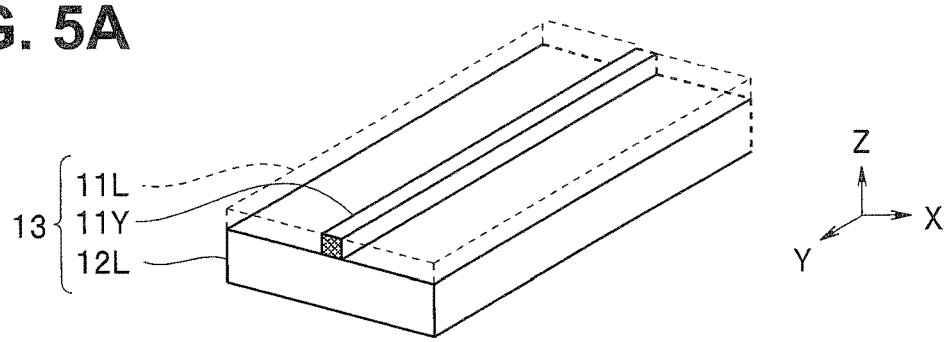
FIG. 5A is a perspective view for explaining the method of manufacturing the wiring board of the first embodiment.

As shown in FIG. 5A, a wiring layer 11L including a conductor pattern 11Y, an end portion of which is linear, is disposed on a substrate 12L, which is an insulating layer, and a single-layer wiring board 13 is manufactured. Thickness and width of the conductor pattern 11Y are respectively, for example, 1 µm or more and 50 µm or less. Note that the conductor pattern 11Y and the metal lead wire 11 of the wiring board 10 are the same member. However, in the explanation of the manufacturing method, the member is referred to as conductor pattern 11Y for convenience of explanation.

The substrate 12L is made of polyimide resin. The substrate 12L only has to be an insulator and may be, for example, epoxy, acrylic, polyester, silicone rubber, or liquid crystal polymer (LCP). Thickness of the substrate 12L is determined taking into account thickness of the conductor pattern 11Y and is, for example, 1 μm or more and 100 μm or less. As explained below, the substrate 12 of the wiring board 10 is configured by a plurality of substrates 12L.

A conductor film (not shown in the figure) disposed over an entire surface of the substrate 12L by a sputtering method, a vapor deposition method, a plating method, or the like is patterned into a predetermined shape by photolithography and etching, whereby the conductor pattern 11Y is formed. In order to control the thickness of the conductor pattern 11Y, polishing may be performed after the conductor film is disposed.

Laser machining or the like may be used for the patterning of the conductor film. A conductor may be disposed on the substrate 12L as the conductor pattern 11Y using various printing techniques (screen printing, inkjet printing, and gravure printing).

As a material of the conductor pattern 11Y, metal having high electrical conductivity such as gold, silver, copper, iron, or nickel or an alloy of these kinds of metal is used. Further, the material of the conductor pattern 11Y only has to be an electric conductor and may be silicon, an inorganic semiconductor, an organic compound semiconductor, grapheme, a transparent electrically conductive material (ITO or $SnO_2$), or the like. When the conductor pattern 11Y is disposed by a printing method, various kinds of electric conductor paste containing particles of silver, copper, or the like may be used. Further, in order to achieve both of electrical conductivity and mechanical strength, the conductor pattern 11Y may be configured by a stacked structure of different materials, for example, a stacked structure of nickel/copper/nickel.

Note that, as explained below, the conductor pattern 11Y can be adapted to various shapes according to specifications of a wiring board. However, in the present embodiment, the conductor pattern 11Y is explained as having a linear simple shape not only at an end portion but also in the entire pattern.

<Stacking Process: S12>

Figure 5B:
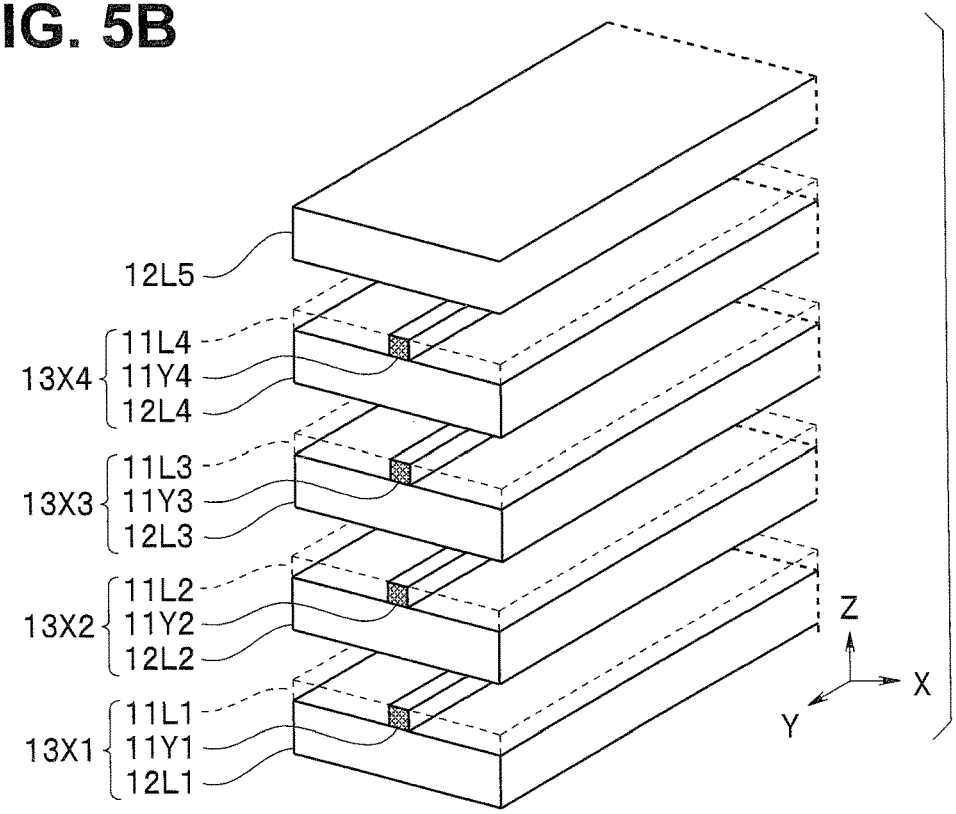
FIG. 5B is a perspective view for explaining the method of manufacturing the wiring board of the first embodiment.

As shown in FIG. 5B, four single-layer wiring boards 13X1 to 13X4, which are respectively configured from the wiring layers 11L including the conductor patterns 11Y and the substrates 12L, are stacked. In this case, end portions of the respective conductor patterns 11Y are stacked to be superimposed in an up-down direction (the Z direction). Note that a substrate 12L5 is further stacked on the single-layer wiring board 13X4. However, explanation of the substrate 12L5 is omitted below.

That is, four wiring layers 11L1 to 11L4 are respectively configured from conductor patterns 11Y1 to 11Y4. The respective wiring layers 11L1 to 11L4 are disposed on substrates 12L1 to 12L4. The number of stacked layers N of the single-layer wiring board 13 only has to be an integer equal to or greater than 2. In a manufacturing method illustrated in FIG. 5B, the number of stacked layers N=4. An upper limit of the number of stacked layers N is, for example, 50 depending on specifications of a wiring board.

<Compression-Bonding Process: S13>

Stacked pluralities of single-layer wiring boards 13X and substrates 12L are compression-bonded, whereby an integral laminated plate 14 is manufactured. Compression-bonding conditions are set according to a material, thickness, and the like of the substrate 12L. The compression-bonding conditions are, for example, temperature of 100° C. to 200 C°, pressure of 0.5 MPa to 5 MPa, and time of 10 seconds to 5 minutes.

The compression-bonded conductor pattern 11Y, an outer circumference of which is covered with the substrate 12L, can be regarded as the metal lead wire 11. That is, the metal lead wire 11 and the conductor pattern 11Y are the same component.

Figure 5C:
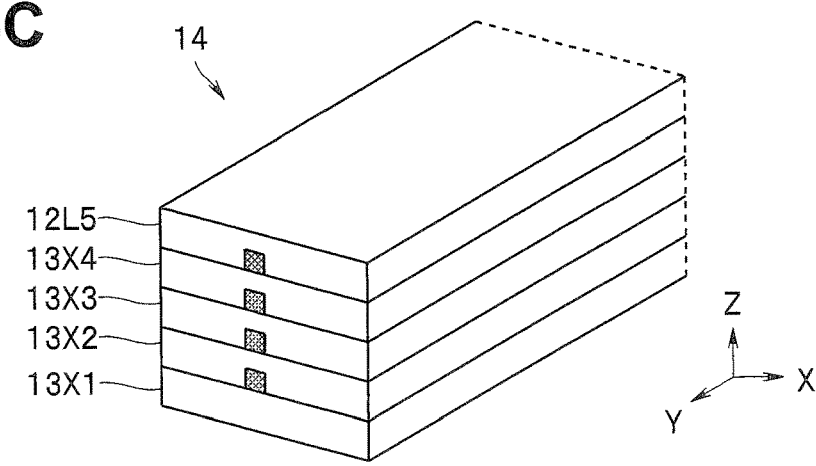
FIG. 5C is a perspective view for explaining the method of manufacturing the wiring board of the first embodiment.
Figure 5D:
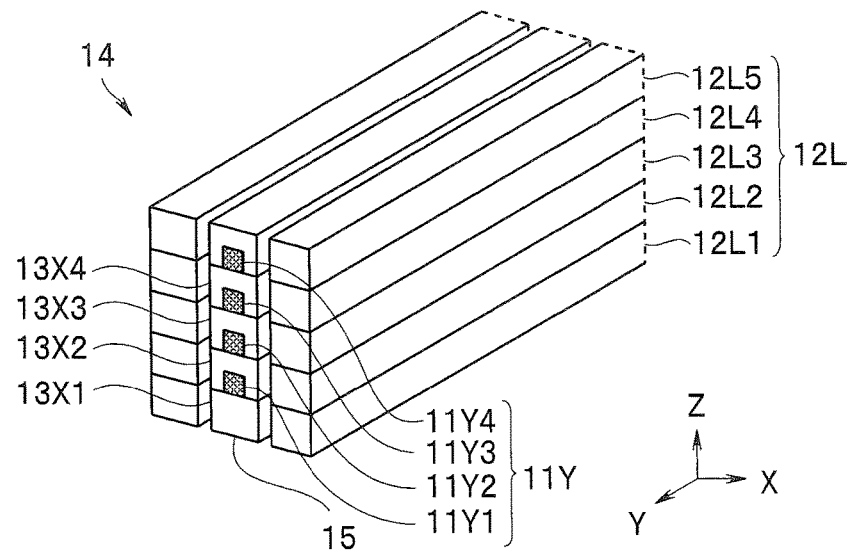
FIG. 5D is a perspective view for explaining the method of manufacturing the wiring board of the first embodiment.

Note that, as shown in FIG. 5D, the laminated plate 14 may be formed as a laminated plate 15 by cutting off and removing end portions in a width direction (an X direction) unnecessary as the wiring board 10.

<Step S20: A Removing Process> Etching Process

Figure 5E:
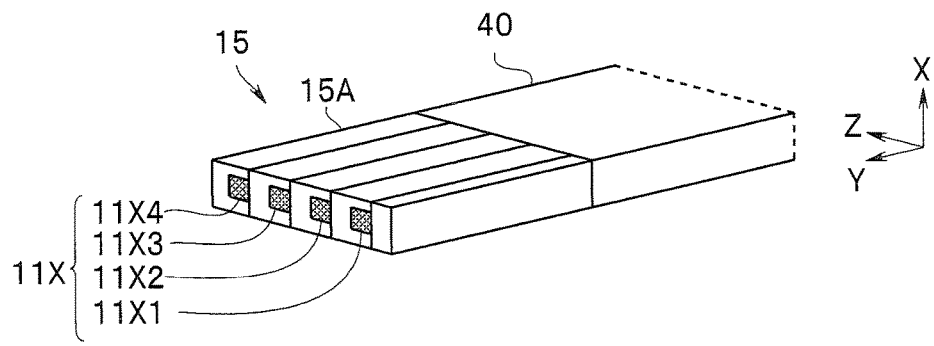
FIG. 5E is a perspective view for explaining the method of manufacturing the wiring board of the first embodiment.

The substrate 12L around the end portion of the metal lead wire 11 of the laminated plate 15 is removed. As shown in FIG. 5E, for selective removal of the substrate 12L, an etching mask 40 is disposed to cover a region excluding an end portion of the laminated plate 15.

The substrate 12L in a region not covered by the etching mask 40 is removed by etching. As an etchant, a solvent that dissolves the substrate 12L but does not affect the metal lead wire 11 is used. For example, when the substrate 12L is made of polyimide and the conductor pattern 11Y is made of copper, wet etching is performed using a non-hydrazine-based alkali water solution as the solvent. For the selective removal of the substrate 12L, laser machining, dicing, cutting, punching, or the like may be used.

Figure 5F:
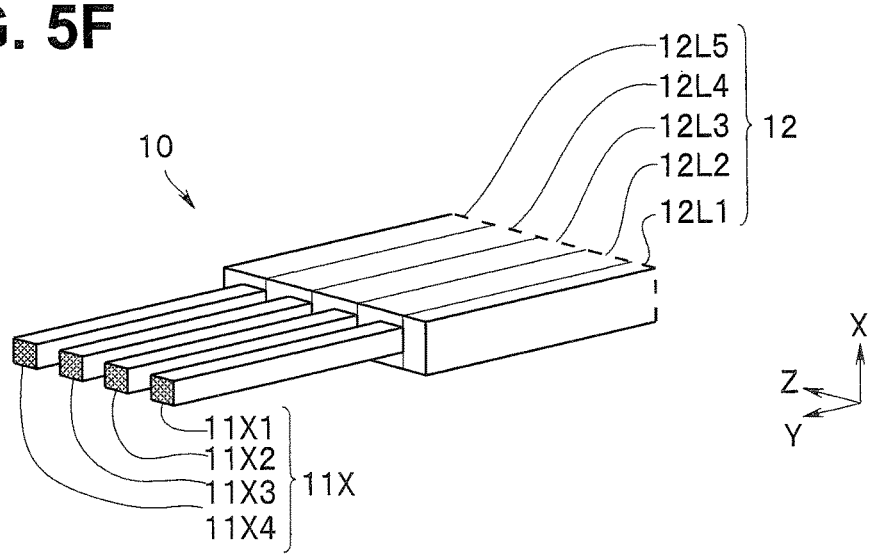
FIG. 5F is a perspective view for explaining the method of manufacturing the wiring board of the first embodiment.

As shown in FIG. 5F, by an etching process, the end portion of the metal lead wire 11 of the laminated plate 15 is machined into the flying lead 11X projecting from an end face and the wiring board 10 is manufactured.

Note that, in the wiring board 10 shown in FIG. 5F, since the etching mask 40 is removed after the etching, the substrate 12 is exposed to an outer surface. However, the etching mask 40 does not have to be removed.

In FIG. 5D, the laminated plate 15 is shown longitudinally long. However, please be particularly aware that, in FIG. 5E, the laminated plate 15 is shown laterally long. That is, in FIG. 5E, a coordinate rotates 90° with respect to FIG. 5D. Therefore, thicknesses of the conductor pattern 11Y and the substrate 12L on the laminated plate 14 (15) are respectively widths of the metal lead wire 11 and the substrate 12L on the wiring board 10. That is, the substrate 12 is configured from a plurality of insulating layers 12L1 to 12L5 stacked in a direction in which a plurality of flying leads 11X1 to 11X5 are disposed in a row.

In the wiring board 10, it is possible to highly accurately control the width (in the Z direction) of the flying lead 11X by controlling the thickness of the conductor pattern 11Y during the manufacturing. Similarly, it is possible to highly accurately control an interval (in the Z direction) of the flying leads 11X by controlling the thickness of the substrate 12L.

The wiring board 10 is manufactured as the laminated plate 15. Therefore, even at a narrow pitch, the plurality of metal lead wires 11 are not affected by an aspect ratio and a disposition pitch and are surely insulated from one another by the substrate 12 (a plurality of substrates 12L) made of the insulator.

As explained above, in the wiring board 10, the flying leads 11X, from which the metal lead wires 11 are exposed, are disposed in a row at an end portion of the substrate 12. At a rear end portion, the metal lead wires 11 and the substrates 12L are alternately disposed in a row in a direction (the Z direction) orthogonal to a major axis direction (a Y direction) in plan view from an X direction. In the insulative substrate 12, a plurality of insulating layers 12L are stacked in a direction in which the plurality of flying leads 11X are disposed in a row (the Z direction).

With the manufacturing method of the present embodiment, it is possible to easily manufacture the wiring board 10 including the narrow-pitch flying leads 11X.

<Modifications of the First Embodiment>

Methods of manufacturing wiring boards 10A and 10B of modifications 1 and 2 of the first embodiment are explained. Note that all of methods of manufacturing wiring boards of modifications and embodiments explained below or the wiring boards of the modifications and the embodiments are similar to the method of manufacturing the wiring board 10 or the wiring board 10 of the first embodiment and have the same effect. Therefore, components having the same functions are denoted by the same reference numerals and signs and explanation of the components is omitted.

<Modification 1>

Figure 6:
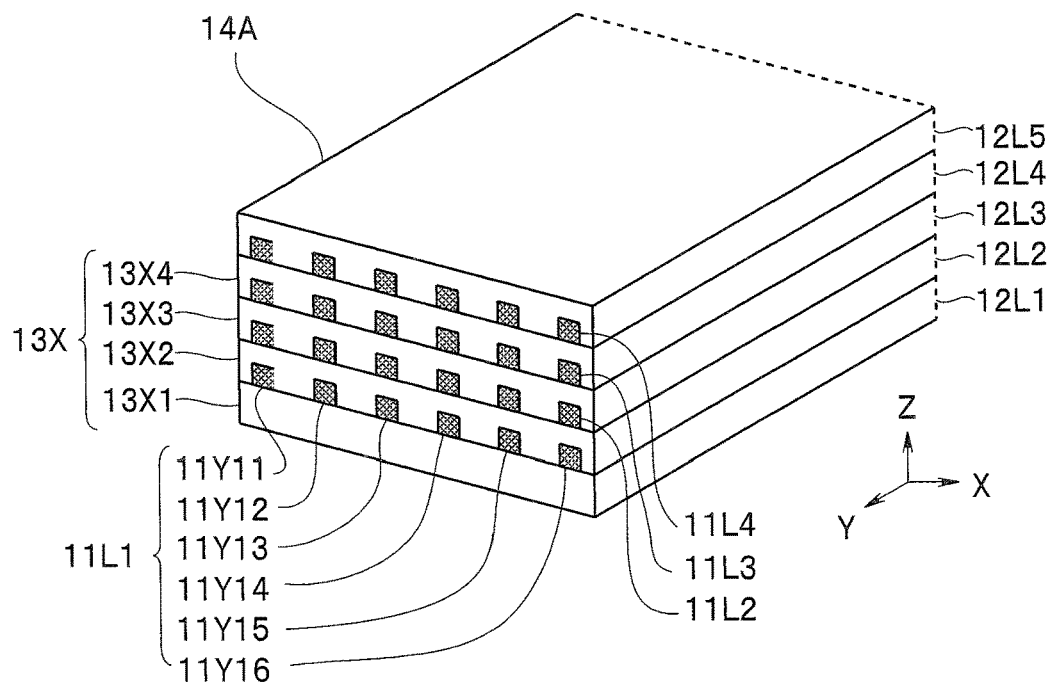
FIG. 6 is a perspective view for explaining a method of manufacturing a wiring board of a modification 1 of the first embodiment.

As shown in FIG. 6, in the method of manufacturing the wiring board 10A of the modification 1, in the manufacturing process of an insulating substrate with a conductor pattern attached (S11), a multi-laminated plate 14A on which N wiring layers 11L, on which K (K is an integer equal to or lager than 2) conductor patterns 11Y are disposed in a row, are stacked respectively via the substrates 12L are manufactured.

Six conductor patterns 11Y11 to 11Y16 are disposed in a row on the wiring layer 11L1. Four single-layer wiring boards 13X1 to 13X4 configured from four substrates 12L1 to 12L4 on which the wiring layers 11L are respectively disposed are stacked. That is, K (the number of conductor patterns)=6 and N (the number of stacked layers)=4.

Figure 7:
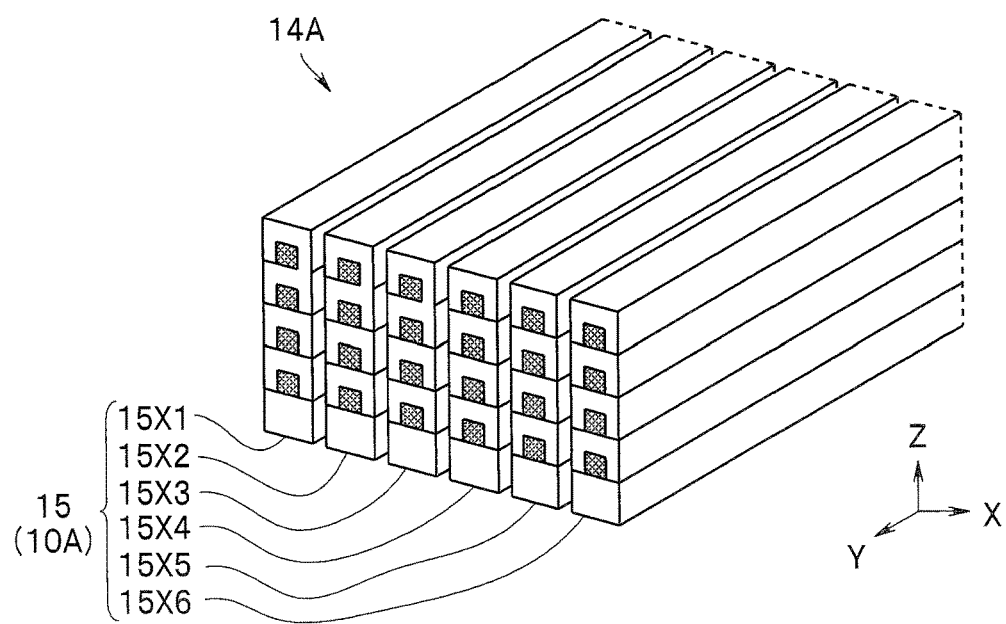
FIG. 7 is a perspective view for explaining the method of manufacturing the wiring board of the modification 1 of the first embodiment.

As shown in FIG. 7, the method of manufacturing the wiring board 10A of the modification 1 includes, after the compression-bonding process (S13), a cutting process (step S14) in which the multi-laminated plate 14A is cut in parallel to an end portion longitudinal direction (the Y direction) of the conductor pattern 11Y1 and singulated into six laminated plates 15X1 to 15X6.

The following processes are the same as the processes of the method of manufacturing the wiring board 10. Six wiring boards 10A each including four flying leads are manufactured from the multi-laminated plate 14A.

The method of manufacturing the wiring board 10A of the modification 1 is more efficient than the method of manufacturing the wiring board 10, which enables the wiring board 10A to be manufactured more inexpensively.

<Modification 2>

A method of manufacturing a wiring board 10B of the modification 2 is explained with reference to FIG. 8A to FIG. 8D. Note that, in the modification 2, K (the number of conductor patterns)=2.

In the method of manufacturing the wiring board 10B of the modification 2, in the stacking process sub-routine S10, a wiring layer disposing process (step S31), an insulating layer disposing process (step S32), and a planarizing process (step S33) are repeatedly performed.

Figure 8A:
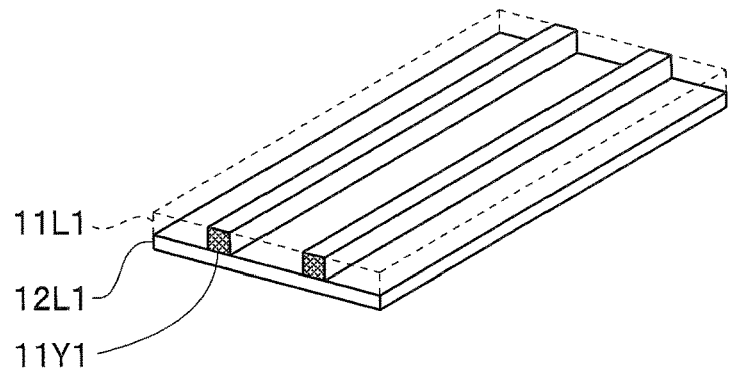
FIG. 8A is a perspective view for explaining a method of manufacturing a wiring board of a modification 2 of the first embodiment.

That is, as shown in FIG. 8A, in the method of manufacturing the wiring board 10B of the modification 2, as in the method of manufacturing the wiring board 10, a disposing process (S31) for a first wiring layer 11L1 including the conductor pattern 11Y1 is performed on the substrate 12L1, which is a first insulating layer, by film formation of a wiring layer and patterning. Note that the substrate 12L is a component same as the insulating layer 12L. However, the substrate 12L and the insulating the layer 12L are sometimes distinguished in the explanation of the manufacturing method.

Figure 8B:
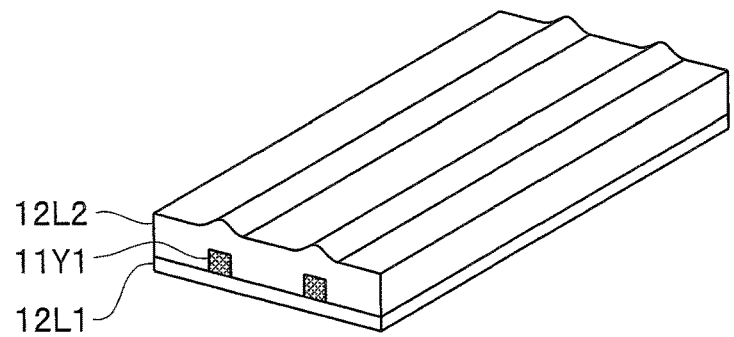
FIG. 8B is a perspective view for explaining the method of manufacturing the wiring board of the modification 2 of the first embodiment.

Subsequently, as shown in FIG. 8B, a second insulating layer disposing process (S32) in which a second insulating layer 12L2 is disposed on the substrate 12L1, on which the first wiring layer 11L1 is disposed, is performed. The second insulating layer 12L2 is disposed by applying, for example, unhardened liquid resin with, for example, a spin coater and hardening the resin. The second insulating layer 12L2 changes to a substrate 12L2.

For the disposition of the second insulating layer 12L2, various printing methods (screen printing, inkjet printing, and gravure printing), a lamination method, transfer methods (stamping and nano-imprint), a casting method, or the like may be used. A material of the second insulating layer 12L2 may be the same as or may be different from a material of the substrate 12L1. Rather than hardening and solidifying the liquid resin, a resin film may be compression-bonded to the substrate 12L1 on which the first wiring layer 11L1 is disposed.

The second insulating layer 12L2 may be made of polyimide resin, epoxy resin, acrylic resin, polyester resin, silicone rubber, or a ceramic material. However, the second insulating layer 12L2 and the like are desirably made of a material that can be removed simultaneously with the substrate 12L1, which is the first insulating layer, in the removing process.

Figure 8C:
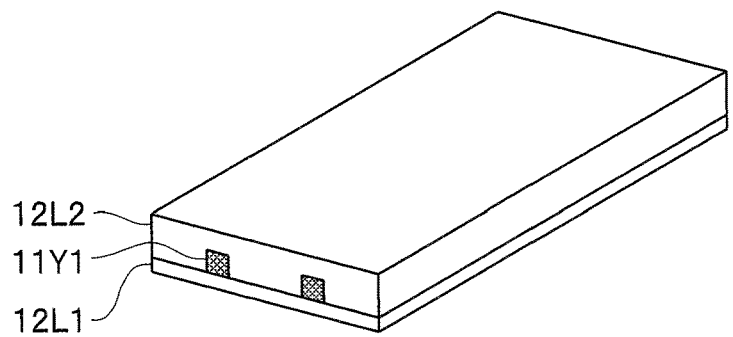
FIG. 8C is a perspective view for explaining the method of manufacturing the wiring board of the modification 2 of the first embodiment.
Figure 8D:
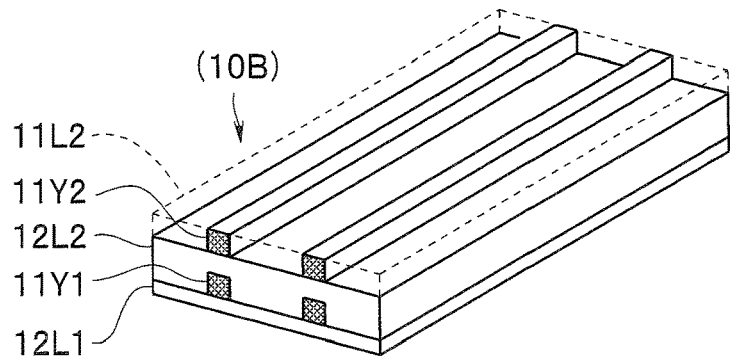
FIG. 8D is a perspective view for explaining the method of manufacturing the wiring board of the modification 2 of the first embodiment.

As shown in FIG. 8B, a region on the first wiring layer 11L1 of the second insulating layer 12L2 is sometimes more convex than other regions. In this case, as shown in FIG. 8C, the planarizing process (S33) for planarizing a surface of the second insulating layer 12L2 is performed. The planarizing process is, for example, a surface polishing process. Note that, when a leveling property of the unhardened resin on the insulating layer is high, the polarizing process is unnecessary.

As shown in 8D, a second wiring layer disposing process (S31A) in which a second wiring layer 11L2 is disposed on the planarized second insulating layer 12L2 is performed. The second wiring layer disposing process (S31A) is the same as the first wiring layer disposing process (S31).

A structure the same as the laminated plate 14 shown in FIG. 5C is manufactured by repeatedly performing the wiring layer disposing process (S31), the insulating layer disposing process (S32), and the planarizing process (S33) N times. The etching process S20 later than the stacking process S10 is the same as the etching process S20 of the method of manufacturing the wiring board 10.

With the method of manufacturing the wiring board 10B of the modification 2, it is possible to easily manufacture, without using a laminated plate compression-bonding manufacturing process, the narrow-pitch wiring board 10B as in the method of manufacturing the wiring board 10.

Note that, in the manufacturing method of the modification 2, the first insulating layer is the individual substrate 12L1 as in the method of manufacturing the wiring board 10. However, the first insulating layer may be disposed by applying the unhardened liquid resin on a base substrate made of fluorocarbon resin or the like having low adhesion intensity and hardening the resin. Note that a laminated body is separated from the base substrate after the stacking process ends.

<Second Embodiment>

A wiring board 10C and a method of manufacturing the wiring board 10C of a second embodiment are explained. Note that, in the wiring board 10C, N (the number of stacked layers)=7 and K (the number of conductor patterns)=6.

Figure 9:
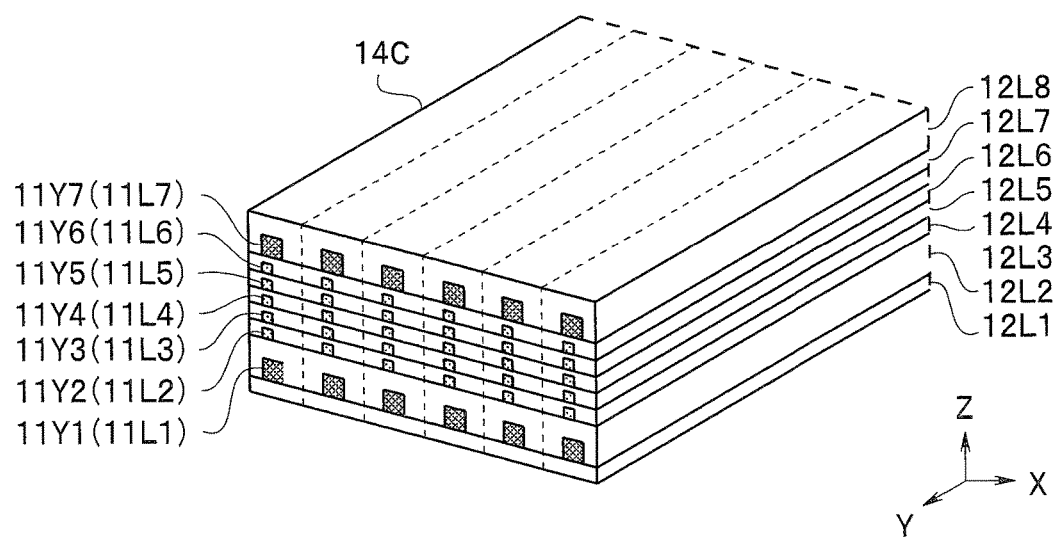
FIG. 9 is a perspective view for explaining a method of manufacturing a wiring board of a second embodiment.

As shown in FIG. 9, in the method of manufacturing the wiring board 10C, in the stacking process (S10), the wiring layer 11L including conductor patterns 11Y1 and 11Y7 having a sectional area different from a sectional area of other conductor patterns 11Y2 to 11Y6, substrates 12L2 and 12L8 having thickness different from thickness of other substrates 12L1 and 12L3 to 12L7, the other wiring layers, the other substrates 12L1 and 12L3 to 12L7 are stacked and a multi-laminated plate 14C is manufactured.

The following processes are the same as the processes of the method of manufacturing the wiring board 10. Six wiring boards 10C each having seven flying leads are manufactured from the multi-laminated plate 14C.

Figure 10:
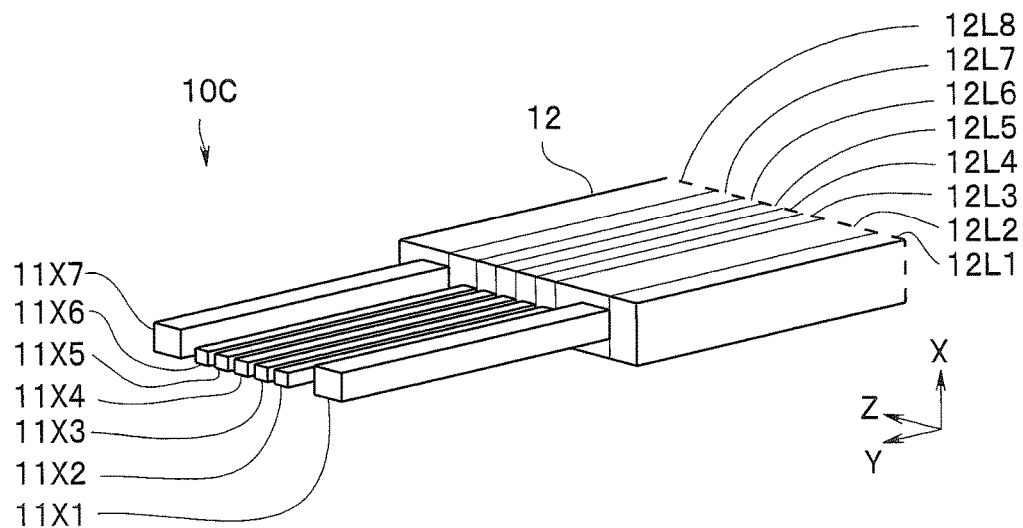
FIG. 10 is a perspective view of the wiring board of the second embodiment.

That is, as shown in FIG. 10, the wiring board 10C includes seven flying leads 11X1 to 11X7 projecting from the end face of the substrate 12 made of an insulator. The wiring board 10C includes the flying leads 11X1 and 11X7 having a sectional area different from a sectional area of the other flying leads 11X2 to 11X6 and the substrates 12L2 and 12L8 having thickness different from thickness of the other substrates 12L1 and 12L3 to 12L7.

For example, the flying leads 11X1 and 11X7 having a large sectional area are power supply lines. The flying leads 11X2 to 11X6 having a small sectional area are signal transmission lines.

Note that a sectional area of the flying lead 11X may be increased or reduced according to, for example, communication speed of a transmission signal. Further, a sectional area of any flying lead 11X may be increased to increase mechanical strength, for example, rigidity.

With the method of manufacturing the wiring board of the present embodiment, it is possible to easily manufacture the wiring board 10C including a plurality of flying leads 11X having different sectional areas (thicknesses). In the wiring board of the present embodiment, the metal conductors 11 (the flying leads 11X) can be changed one by one according to a signal to be transmitted.

<Modifications of the Second Embodiment>

In the method of manufacturing the wiring board 10C of the second embodiment, in the stacking process (S10), the wiring layer including the conductor patterns having the sectional area different from the sectional area of the other wiring layers, the insulating layers (the substrates) having the thickness different from the thickness of the other insulating layers, the other wiring layers, and the other insulating layers (the substrates) are stacked and the laminated plate 14C is manufactured.

On the other hand, in a method of manufacturing a wiring board of a modification of the second embodiment, in the stacking process (S10), wiring layers including conductor patterns having at least one of a shape and a material different from at least one of a shape and a material of conductor patterns of other wiring layers and the other wiring layers are stacked. In a stacking process of another modification, insulating layers having at least one of a shape and a material different from at least one of a shape and a material of other insulating layers and the other insulating layers are stacked. Further, in a stacking process of another modification, wiring layers including conductor patterns having at least one of a shape and a material different from at least one of a shape and a material of conductor patterns of other wiring layers, insulating layers having at least one of a shape and a material different from at least one of a shape and a material of other insulating layers, the other wiring layers, and the other insulating layers are stacked.

The wiring board of the modification of the second embodiment includes flying leads having at least one of a shape and a material different from at least one of a shape and a material of other flying leads. The wiring board of another modification includes substrates (insulating layers) having at least one of a shape and a material different from at least one of a shape and a material of other substrates (insulating layers). Further, the wiring board of another modification includes flying leads having at least one of a shape and a material different from at least one of a shape and a material of other flying leads and substrates (insulating layers) having at least one of a shape and a material different from at least one of a shape and a material of other substrates (insulating layers).

<Modification 1 of the Second Embodiment>

Figure 11A:
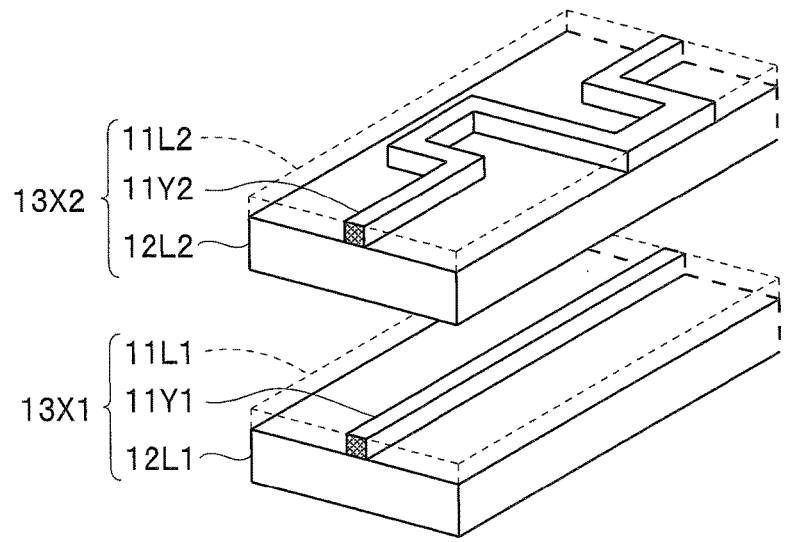
FIG. 11A is a perspective view for explaining a method of manufacturing the wiring board of a modification 1 of the second embodiment.

In a method of manufacturing a wiring board of a modification 1 of the second embodiment, as shown in FIG. 11A, in the stacking process (S10), the substrate 12L2 on which the conductor pattern 11Y2 having a shape different from a shape of the conductor pattern 11Y1 of other substrates is disposed, is stacked. Note that, in FIG. 11A, only single-layer wiring boards 13X1 and 13X2 of two layers are shown. However, actually, single-layer wiring boards 13X1 to 13X4 of four layers are stacked. The single-layer wiring boards 13X2 and 13X3 among the single-layer wiring boards 13X1 to 13X4 include the conductor pattern 11Y2 different from conductor patterns of the other single-layer wiring boards 13X1 and 13X4.

An end portion of the conductor pattern 11Y2 of the single-layer wiring board 13X2 has a linear shape. However, a rear end portion of the conductor pattern 11Y2 has a crank shape bent at a right angle.

Figure 11B:
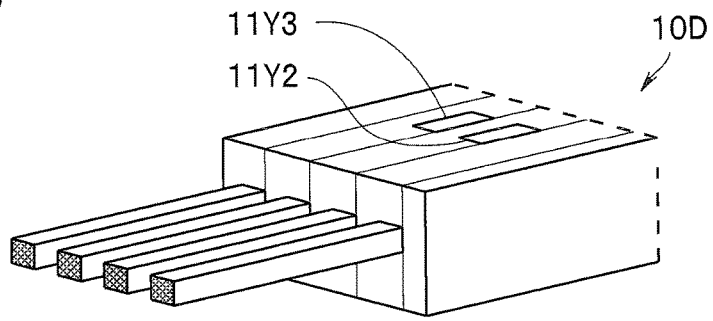
FIG. 11B is a perspective view of the wiring board of the modification 1 of the second embodiment.

As shown in FIG. 11B, in a wiring board 10D of the modification 1 of the second embodiment, a part of the conductor patterns 11Y2 and 11Y3 is exposed on an upper surface.

Note that a shape of the conductor pattern 11Y (the metal lead wire 11) is not limited to the linear shape or the crank shape and may be a curved shape and can be designed freely. A plurality of conductor patterns having three or more kinds of different shapes and thicknesses may be stacked. Note that, as explained below, in the present invention, the shape does not mean only a plan view shape and is a concept including a sectional area, that is, thickness and width.

<Modification 2 of the Second Embodiment>

In a method of manufacturing a wiring board of a modification 2 of the second embodiment, in the stacking process (S10), the substrate 12L2 having thickness and a material different from thickness and a material of other insulating layers (substrates) and the other insulating layers are stacked.

Figure 12:
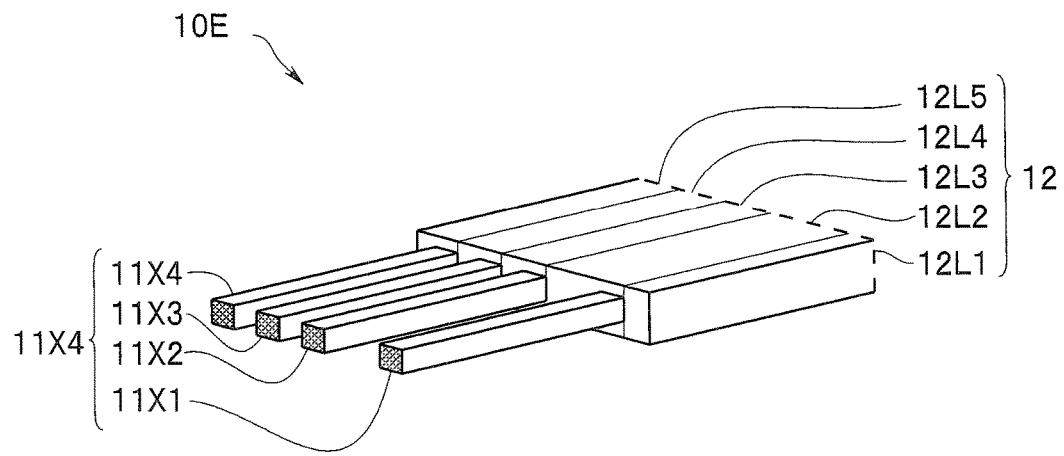
FIG. 12 is a perspective view of a wiring board of a modification 2 of the second embodiment.

For example, in a wiring board 10E shown in FIG. 12, thickness and a material of the substrates 12L1 and 12L2 are different from thickness and a material of the other substrates 12L3 to 12L5.

Among the four flying leads 11X, the flying lead 11X1 is a power supply line and the flying leads 11X2 to 11X4 are signal transmission lines. The substrates 12L3 to 12L5 are made of a porous silica-based material, which is a low-dielectric constant material, suitable for high-speed signal transmission. The substrates 12L1 and 12L2 are made of polyimide excellent in insulation.

The wiring board 10E is of high-performance because a material of the substrate 12L can be selected according to a use of a flying lead.

It is possible to improve a transmission characteristic, mechanical strength, and the like of the wiring board 10 by selecting, for each substrate 12L, according to a type of a signal transmitted by the flying lead 11X, at least one of a shape and a material of the substrate 12L that covers the flying lead 11X. For example, a configuration may be adopted in which glass epoxy resin (FR4: Flame Retardant Type 4) having a high dielectric constant is disposed around the flying lead 11X of a GND line, a material (nylon or acrylic resin) having high heat resistance and high humidity resistance is disposed on the substrate 12L in an outermost circumference, and a material having a low modulus of elasticity is disposed on the substrate 12L on an inside. Materials and the like of two substrates 12L that hold the flying lead 11X from both sides may be the same or may be different. Further, a multilayer structure may be adopted in which the respective substrates 12L are made of different materials.

As explained above, a material of the conductor pattern 11Y functioning as the flying lead 11X can also be selected for each conductor pattern 11Y according to a transmission characteristic, mechanical strength, or the like of the flying lead 11X. For example, a material having high electric conductivity (e.g., gold) may be selected for the flying lead 11X functioning as the GND line. A material having high rigidity (e.g., copper) may be selected for the flying lead 11X in the outermost circumference.

As explained above, with the manufacturing methods of the present embodiment and the modifications, by appropriately selecting, for each flying lead 11X and each substrate 12L, the materials and the shapes (the plan view shapes, the thicknesses, and the sectional areas) of the flying lead 11X and the substrate 12L, it is possible to provide a wiring board having excellent characteristics corresponding to a type of a signal transmitted by an inner lead and external factors (pressure, temperature, and humidity).

<Third Embodiment>

Figure 13:
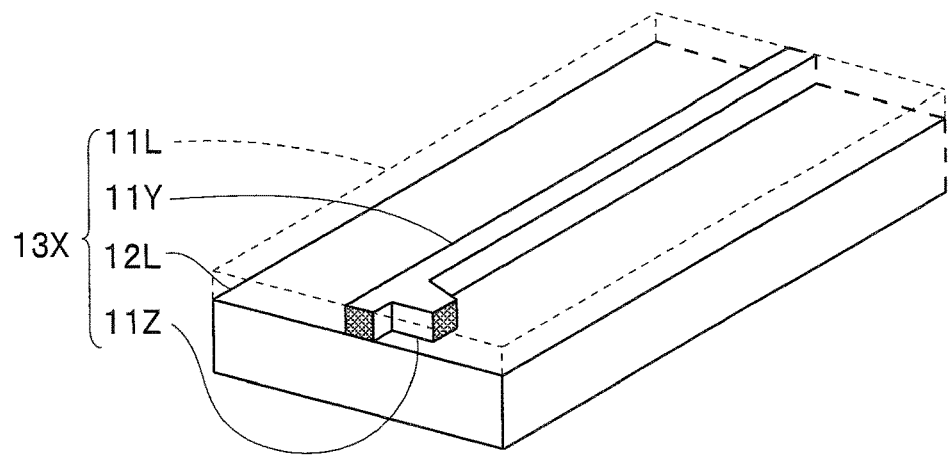
FIG. 13 is a perspective view for explaining a method of manufacturing a wiring board of a third embodiment.

As shown in FIG. 13, in a method of manufacturing a wiring board 10F of a third embodiment, an extended section 11Z extended to one side of a width direction is present at the end portion of the conductor pattern 11Y of the wiring layer 11L stacked in the stacking process (S10). In the removing process 20, the extended section 11Z changes to another member, for example, a connected section 11Z connected to the bonding electrode 22 of the semiconductor chip 20. That is, the extended section 11Z and the connected section 11Z are the same component.

The extended section 11Z is simultaneously manufactured by patterning of a conductor film when the conductor pattern 11Y is disposed. For example, when the conductor pattern 11Y is patterned from the conductor film by an etching method, a region to be the extended section 11Z is included in a pattern of an etching mask.

Figure 14:
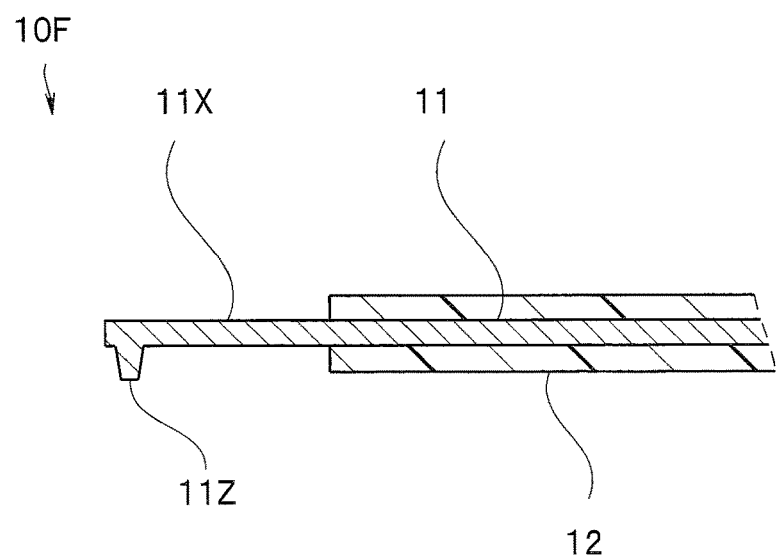
FIG. 14 is a sectional view of the wiring board of the third embodiment.

As shown in FIG. 14, the wiring board 10F is an integral object without a boundary in which the flying lead 11X projecting from an end face includes, at an end portion, a connected section 11Z extended in a longitudinal perpendicular direction (the X direction) and connected to electrodes of another member, for example, the bonding electrode 22 of the semiconductor chip 20 and the flying lead 11X and the connected section 11Z are made of the same material. For example, when the flying lead 11X and the connected section 11Z are made of a polycrystal film, crystal extending across regions of the flying lead 11X and the connected section 11Z is sometimes present.

The connected section (the extended section) 11Z is used instead of a bump. Therefore, length of the extended section 11Z is the same as height of the bump, for example, 40 μm or more and 100 μm or less.

The wiring board 10F includes the extended section 11Z simultaneously manufactured when the conductor pattern 11Y is disposed. Therefore, a bump disposing process is unnecessary.

<Fourth Embodiment>

Figure 15A:
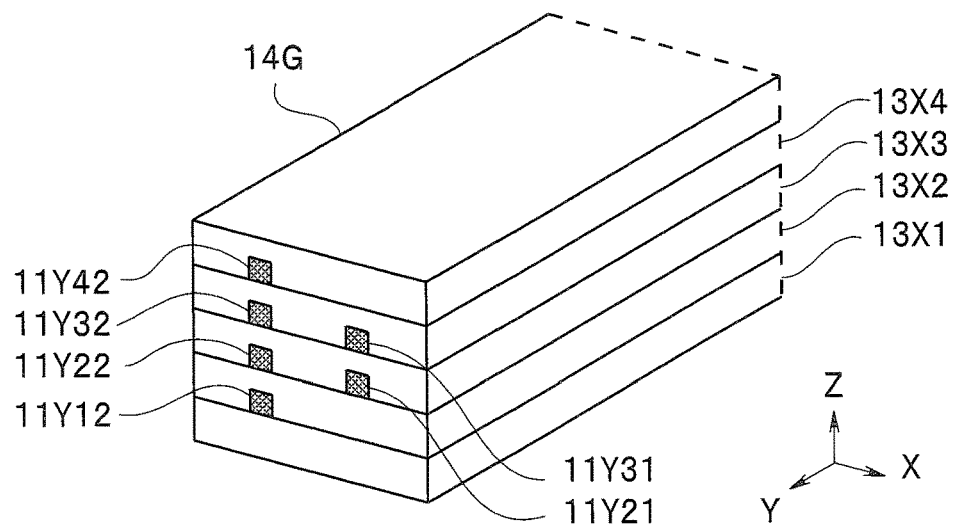
FIG. 15A is a perspective view for explaining a method of manufacturing a wiring board of a fourth embodiment.

As shown in FIG. 15A, in a method of manufacturing a wiring board 10G of a fourth embodiment, the single-layer wiring boards 13X2 and 13X3 of a laminated plate 14G manufactured in the stacking process include first conductor patterns 11Y21 and 11Y31 and second conductor patterns 11Y22 and 11Y32, respective end portions of which are disposed in a row in parallel.

The laminated plate 14G is similar to the multi-laminated plate 14A of the modification 1. However, unlike the laminated plate 14A, the laminated plate 14G is not cut into a plurality of laminated plates, each having one conductor pattern. However, the laminated plate 14G may be manufactured by cutting a multi-laminated plate into M pieces, in which 2M (M is an integer equal to or greater than 2) conductor patterns are disposed in a row in each of wiring layers.

Figure 15B:
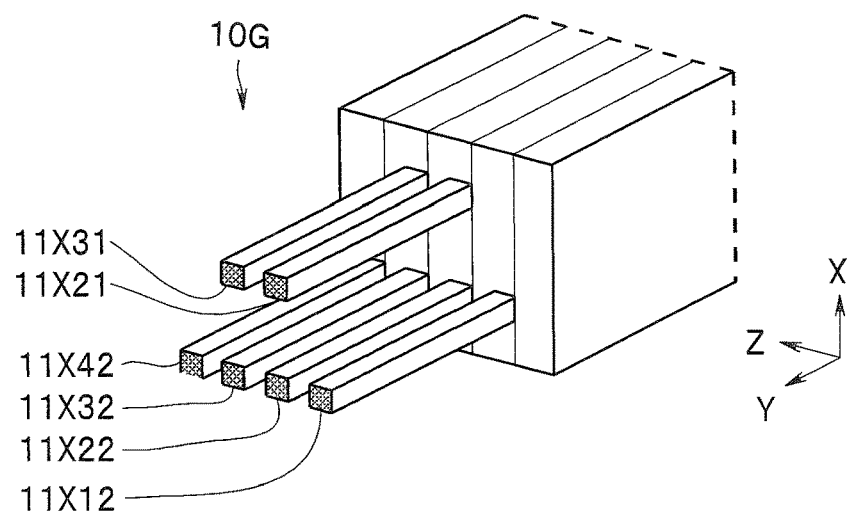
FIG. 15B is a perspective view of the wiring board of the fourth embodiment.

In the removing process, as shown in FIG. 15B, the end portions of the first conductor patterns 11Y21 and 11Y31 and the end portions of the second conductor patterns 11Y22 and 11Y32 are machined into two flying leads 11X21 and 11X22 and two flying leads 11X31 and 11X32, which are respectively superimposed in the major axis perpendicular direction (the X direction).

The wiring board 10G of the fourth embodiment includes a first flying lead group including a plurality of first flying leads 11X21 and 11X31 projecting from an end face and a second flying lead group including a plurality of second flying leads 11X12, 11X22, 11X32, and 11X42 located in the longitudinal perpendicular direction (the X direction) with respect to the first flying lead group. That is, the wiring board 10G has a structure in which the first flying lead 11)(21 and the second flying lead 11X22 overlap and the first flying lead 11X31 and the second flying lead 11X32 overlap in the longitudinal perpendicular direction (the X direction).

Figure 16:
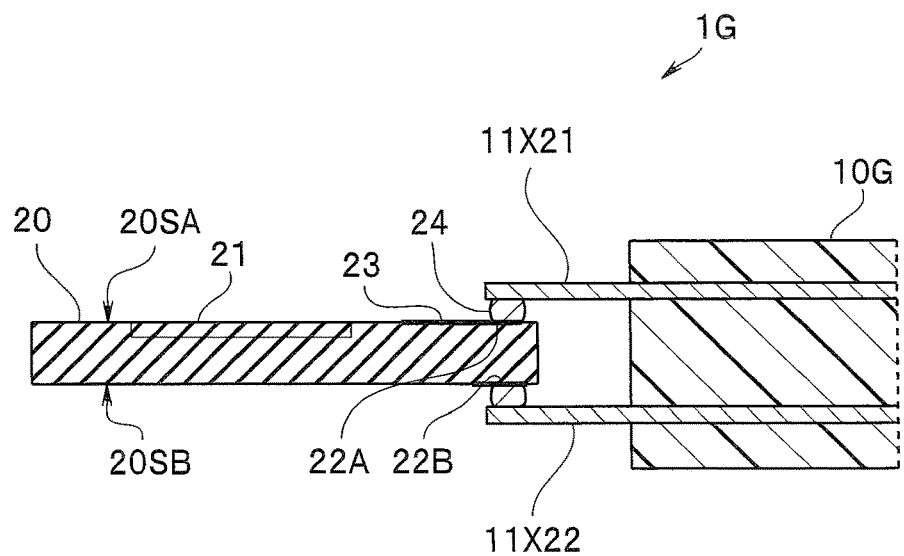
FIG. 16 is a sectional view of a semiconductor apparatus including the wiring board of the fourth embodiment.

As shown in FIG. 16, in a semiconductor device 1G, the wiring board 10G is bonded to vertically sandwich the semiconductor chip 20 with the first flying lead 11X21 and the like belonging to the first flying lead group and the second flying lead 11X22 and the like belonging to the second flying lead group.

In other words, the first flying lead 11X21 and the like and the second flying lead 11X22 and the like are bonded to bonding electrodes 22A and 22B on surfaces 20SA and 20SB of the semiconductor chip 20 to which the first flying lead 11X21 and the like and the second flying lead 11X22 and the like are opposed.

The wiring board 10G is manufactured from the laminated plate 14G on which the single-layer wiring board 13X is stacked. Therefore, it is possible to easily realize disposition of such complicated flying leads.

Note that the number of the first flying leads and the number of the second flying leads may be the same. At least one of shapes and materials of the first flying leads and the second flying leads may be different.

<Modification of the Fourth Embodiment>

In a method of manufacturing a wiring board 10H of a modification of the fourth embodiment, as in the method of manufacturing the wiring board 10G, the single-layer wiring boards 13X2 and 13X3 of the laminated plate 14G include the first conductor patterns 11Y21 and 11Y31 and the second conductor patterns 11Y22 and 11Y32, respective end portions of which are disposed in a row in parallel.

Further, in the method of manufacturing the wiring board 10H, as in the manufacturing method of the third embodiment, the extended section 11Z extended to one side of the width direction is present at an end portion of a conductor pattern disposed on a single-layer wiring board. An extended section 11Z1 of the first conductor pattern and an extended section 11Z2 of the second conductor pattern have different lengths.

Figure 17:
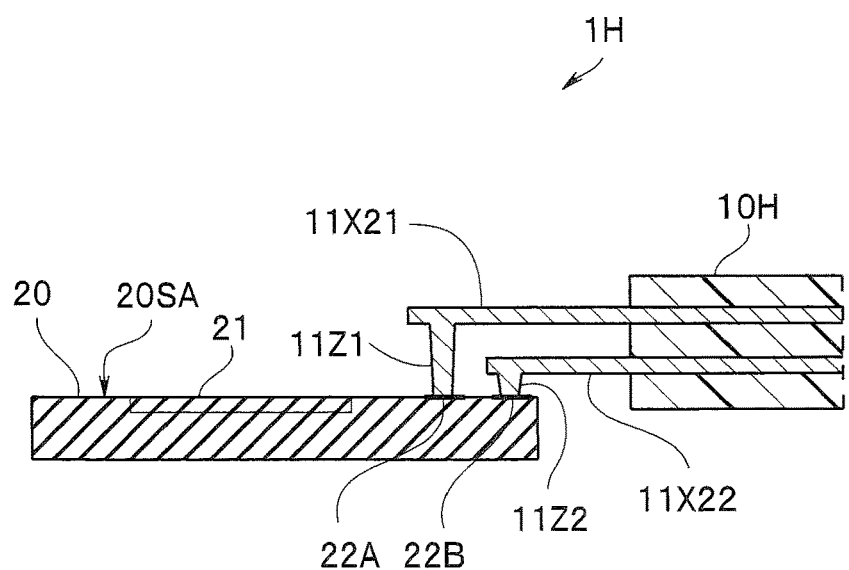
FIG. 17 is a sectional view of a semiconductor apparatus including a wiring board of a modification 1 of the fourth embodiment.

Therefore, as shown in FIG. 17, in the wiring board 10H, an end face of the connected section 11Z1 of the first flying lead 11X21 and an end face of the connected section 11Z2 of the second flying lead 11X22 are present on the same plane, that is, the principal plane 20SA of the semiconductor chip 20 and are respectively bonded to the bonding electrodes 22A and 22B.

Therefore, in a semiconductor device 1H, the flying lead 11X is bonded to the semiconductor chip 20 at high density not via a bump.

<Fifth Embodiment>

In a method of manufacturing a wiring board 10I of a fifth embodiment, in the cutting process of a laminated plate 14I (S14), the laminated plate 14I is cut such that a side surface of the conductor pattern 11L is exposed.

Figure 18A:
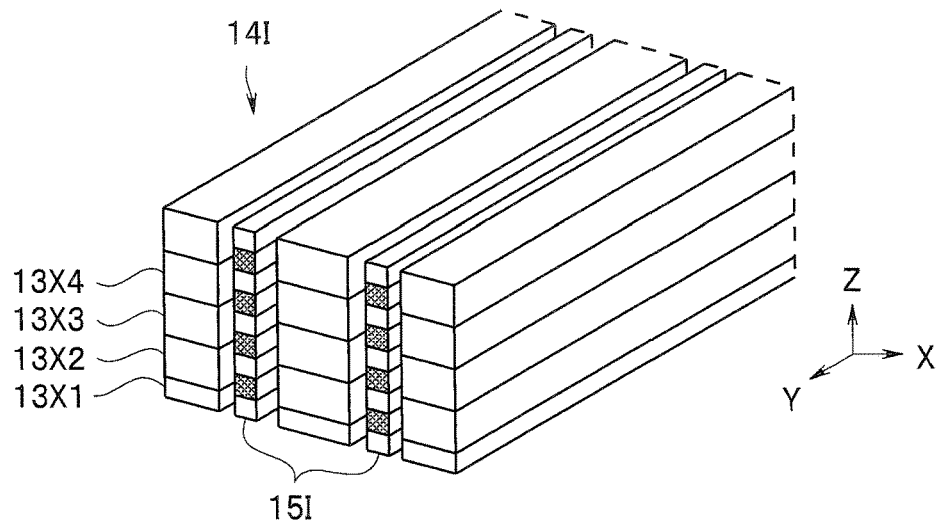
FIG. 18A is a perspective view for explaining a method of manufacturing a wiring board of a fifth embodiment.

As shown in FIG. 18A, the laminated plate 14I (K (the number of conductor patterns)=2 and N (the number of stacked layers)=4), on which four single-layer wiring boards 13X1 to 13X4 each having two conductor patterns are stacked, is cut into two laminated plates 15I.

Figure 18B:
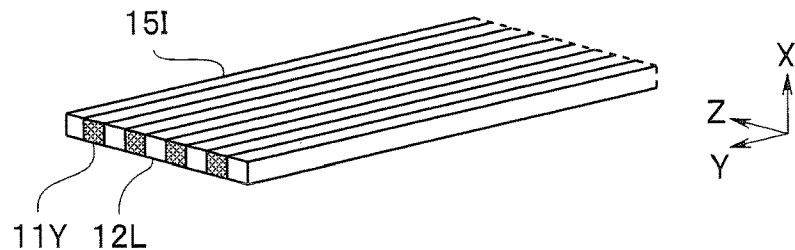
FIG. 18B is a perspective view for explaining the method of manufacturing the wiring board of the fifth embodiment.
Figure 18C:
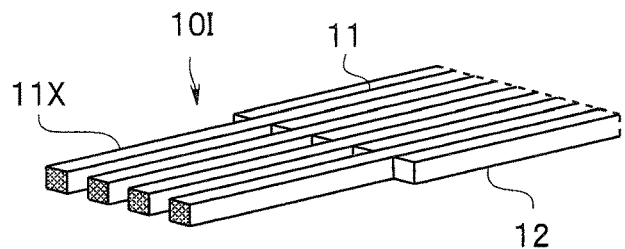
FIG. 18C is a perspective view of the wiring board of the fifth embodiment.
Figure 19:
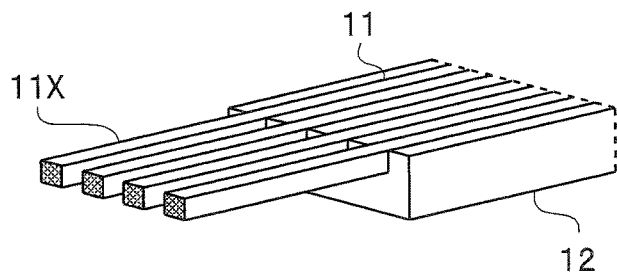
FIG. 19 is a perspective view of a wiring board of a modification 1 of the fifth embodiment.

At this point, as shown in FIG. 18A, FIG. 18B, and FIG. 19, in the wiring board 10I, both side surfaces of the metal lead wire 11 are exposed.

Note that, after the cutting process (S14), the manufacturing method may further include a polishing process (S15) in which a cut surface on which the metal lead wire 11 is exposed is polished. For the polishing process, for example, a CMP method is used.

<Modifications of the Fifth Embodiment>

In a method of manufacturing a wiring board 10J of a modification 1 shown in FIG. 19, in the cutting process (S14), the laminated plate 14I is cut such that only one side surface of the metal lead wire 11 is exposed.

On the wiring board or the like of the fifth embodiment in which the side surface of the metal lead wire (the conductor pattern 11Y) 11 is exposed, it is easy to surface-mount electronic components.

Figure 20:
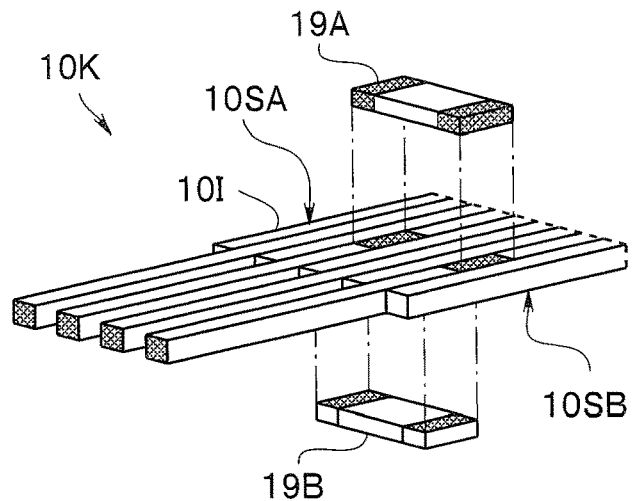
FIG. 20 is an exploded perspective view of a wiring board of a modification 2 of the fifth embodiment.

For example, a method of manufacturing a wiring board 10K of a modification 2 shown in FIG. 20 includes a mounting process (S16) for surface-mounting electronic components 19A and 19B respectively on both surfaces 10SA and 10SB of the wiring board 10I.

Figure 21:
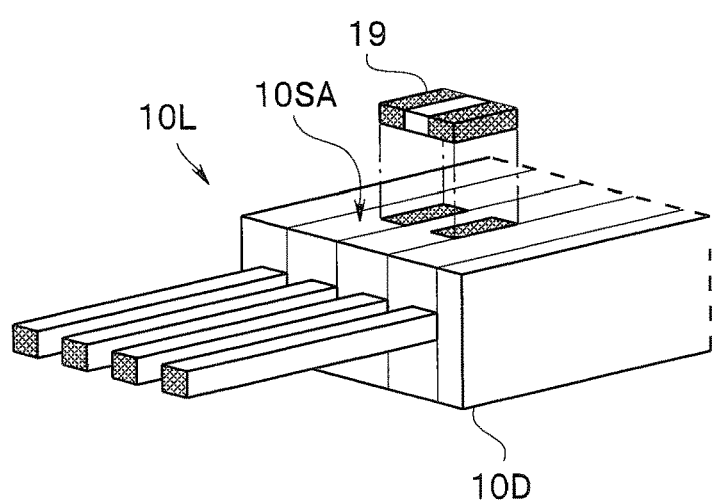
FIG. 21 is an exploded perspective view of a wiring board of a modification 3 of the fifth embodiment.

In a wiring board 10L of a modification 3 shown in FIG. 21, in the mounting process (S16), an electronic component 19 is surface-mounted on one surface 10SA of the wiring board 10D shown in FIG. 12.

In a wiring board of an embodiment of the present invention, a shape of the metal lead wire 11 on an inside of the wiring board has a high degree of freedom of shape design of a conductor pattern. Therefore, various exposed surfaces can be formed. Therefore, it is possible to set a mounting surface of electronic components and a bonded section (an exposed section of the metal lead wire) according to specifications.

Figure 22A:
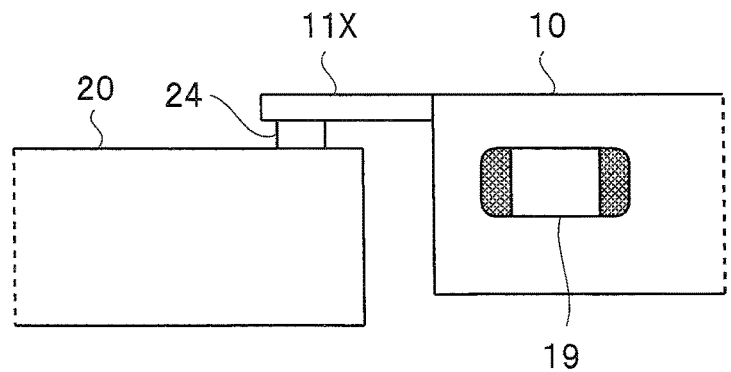
FIG. 22A is a side view of a wiring board of a modification 4 of the fifth embodiment.
Figure 22B:
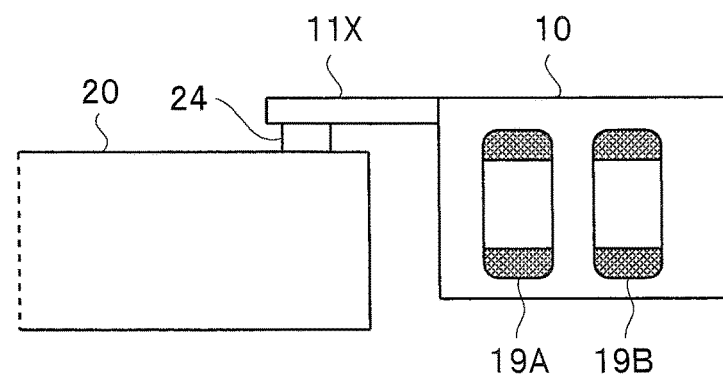
FIG. 22B is a side view of a wiring board of a modification 5 of the fifth embodiment.
Figure 22C:
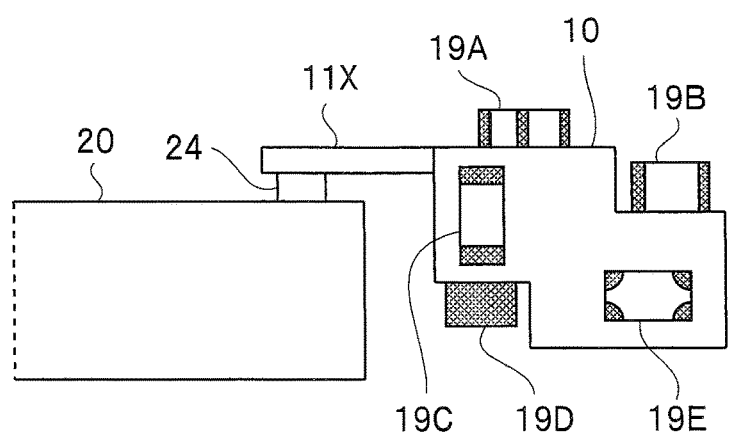
FIG. 22C is a side view of a wiring board of a modification 6 of the fifth embodiment.

For example, in a wiring board of a modification 4 shown in FIG. 22A, one electronic component 19 is mounted on a side surface. In a wiring board of a modification 5 shown in FIG. 22B, two electronic components 19A and 19B are mounted on a side surface. In a wiring board of a modification 6 shown in FIG. 22C, electronic components 19A to 19E are mounted on upper and lower surfaces and a side surface. The electronic component 19A has bonded sections (hatching regions in the figure) in three parts. The electronic component 19E has bonded sections in four parts.

Note that, to mount the electronic components on the side surface of the wiring board, for example, concave sections piercing through the plurality of substrates 12L from the side surface may be formed to expose the metal lead wire 11 on bottom surfaces of the concave sections.

Figure 23:
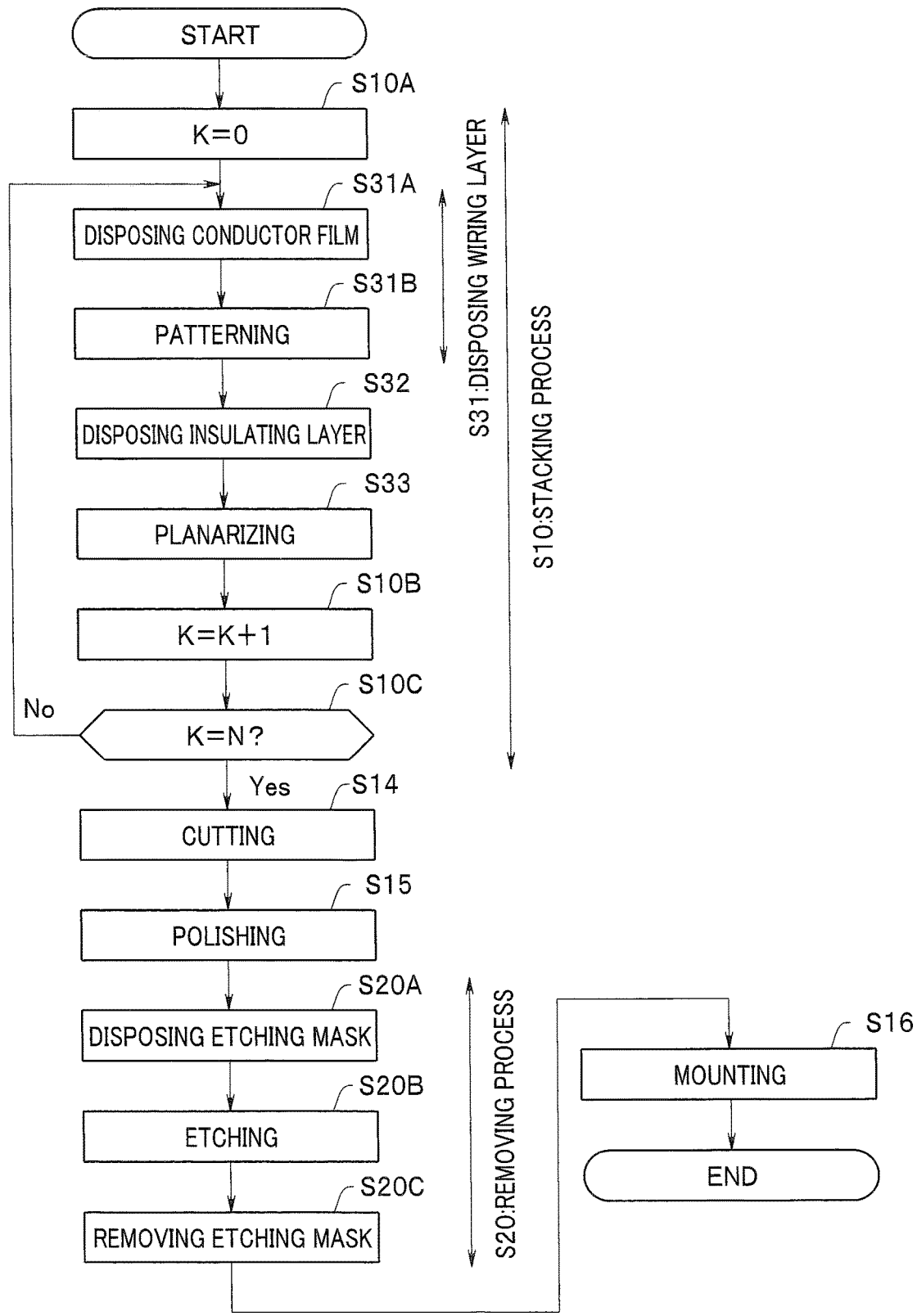
FIG. 23 is a flowchart for explaining a method of manufacturing a wiring board of an embodiment.

Lastly, a flowchart in which all the processes explained above are enumerated is shown in FIG. 23.

The present invention is not limited to the embodiments and the modifications explained above and, for example, can be variously changed, altered, and combined in a range in which the gist of the present invention is not changed.

What is claimed is:

1. A method of manufacturing a wiring board comprising:
   a stacking process in which N (N is an integer equal to or greater than 2) wiring layers, end portions of which include linear conductor patterns, are stacked, with the end portions superimposed, via insulating layers provided among the wiring layers and a laminated plate is manufactured; and
   a removing process in which the insulating layers around the end portions of the conductor patterns of the laminated plate are removed to machine the end portions into N flying leads projecting from an end face.

2. The method of manufacturing the wiring board according to claim 1, wherein
   in the stacking process, a multi-laminated plate on which a wiring layer, on which K (K is an integer equal to or greater than 2) pieces of the conductor pattern are disposed in a row, is stacked is manufactured, and
   the method of manufacturing the wiring board further comprises a cutting process in which the multi-laminated plate is cut in parallel to a longitudinal direction of the end portion to be singulated into K pieces of the laminated plate.

3. The method of manufacturing the wiring board according to claim 1, wherein, in the stacking process, N single-layer wiring boards configured from insulator substrates, on which the wiring layers are respectively disposed, are compression-bonded.

4. The method of manufacturing the wiring board according to claim 1, wherein, in the stacking process, a wiring-layer disposing process in which the wiring layer is disposed on the insulating layer and an insulating-layer disposing process in which a next insulating layer is disposed on the insulating layer on which the wiring layer is disposed are repeated N times.

5. The method of manufacturing the wiring board according to claim 1, wherein, in the stacking process, wiring layers including conductor patterns having at least one of a shape and a material different from at least one of a shape and a material of conductor patterns of other wiring layers and the other wiring layers are stacked.

6. The method of manufacturing the wiring board according to claim 1, wherein, in the stacking process, insulating layers having at least one of a shape and a material different from at least one of a shape and a material of other insulating layers and the other insulating layers are stacked.

7. The method of manufacturing the wiring board according to claim 1, wherein
   an extended section extended to one side in a width direction of the end portion of the conductor pattern is present, and
   in the removing process, the extended section changes to a connected section connected to another member.

8. The method of manufacturing the wiring board according to claim 1, wherein
   at least any one of the wiring layers includes a first conductor pattern and a second conductor pattern, the respective end portions of which are disposed in a row in parallel, and in the removing process, the end portion of the first conductor pattern and the end portion of the second conductor pattern are machined into two flying leads superimposed in a major axis perpendicular direction.

9. The method of manufacturing the wiring board according to claim 2, wherein, in the cutting process, the multi-laminated plate is cut such that at least a part of at least one side surface of the conductor pattern is exposed.

10. The method of manufacturing the wiring board according to claim 1, further comprising, after the cutting process, a polishing process in which a cut surface on which at least a part of the conductor pattern is exposed is polished.

11. The method of manufacturing the wiring board according to claim 9, further comprising a mounting process in which a chip component is surface-mounted on the exposed part of the conductor pattern.

* * * * *